United States Patent [19]

Deutsch et al.

[11] 4,221,000
[45] Sep. 2, 1980

[54] IMPROVED BUBBLE DOMAIN STORAGE ARRAY

[75] Inventors: Alina Deutsch, Mount Kisco; Mark H. Kryder, Yorktown Heights, both of N.Y.; Walter Nystrom, San Jose, Calif.

[73] Assignee: International Business Machines Corporation, Armonk, N.Y.

[21] Appl. No.: 902,657

[22] Filed: May 4, 1978

[51] Int. Cl.² .............................................. G11C 19/08
[52] U.S. Cl. .......................................... 365/2; 365/8; 365/15
[58] Field of Search .............................. 365/2, 7, 8, 15

[56] References Cited

U.S. PATENT DOCUMENTS

| | | | |
|---|---|---|---|
| 3,703,712 | 11/1972 | Bobeck et al. | 365/2 |
| 3,750,154 | 7/1973 | Almasi | 365/8 |
| 4,075,611 | 2/1978 | Gergis | 365/15 |

*Primary Examiner*—James W. Moffitt
*Attorney, Agent, or Firm*—Jackson E. Stanland

[57] ABSTRACT

A magnetic bubble domain storage system comprising an array of rows and columns of logical chips are organized into logical half-chips with even numbered bits in one half-chip and odd numbered bits in the other half-chip. Alternating rows of half-chips are used for storing even numbered bits and odd numbered bits, respectively. Each half-chip has its own bubble domain generator, but a common generator current line serves all generators for a row of even half-chips and all generators for a row of odd half-chips. Thus, information is written into even half-chips and odd half-chips at the same time by pulsing the generator current line common to a row of even half-chips and a row of odd half-chips. Each half-chip has a sensing element and all the sensing elements corresponding to a row of half-chips are connected in series. The series connection of sensors in any row forms one leg of a bridge circuit, and another leg of the bridge circuit is another series connection of sensors in another row of the storage array. One of these legs corresponds to sensors from a row of even half-chips while the other leg corresponds to sensors from a row of odd half-chips. The other two legs of the bridge circuit are comprised of dummy resistors. Even though two rows of sensors are connected to the same bridge circuit, even numbered bits and odd numbered bits will be read at alternating times.

12 Claims, 7 Drawing Figures

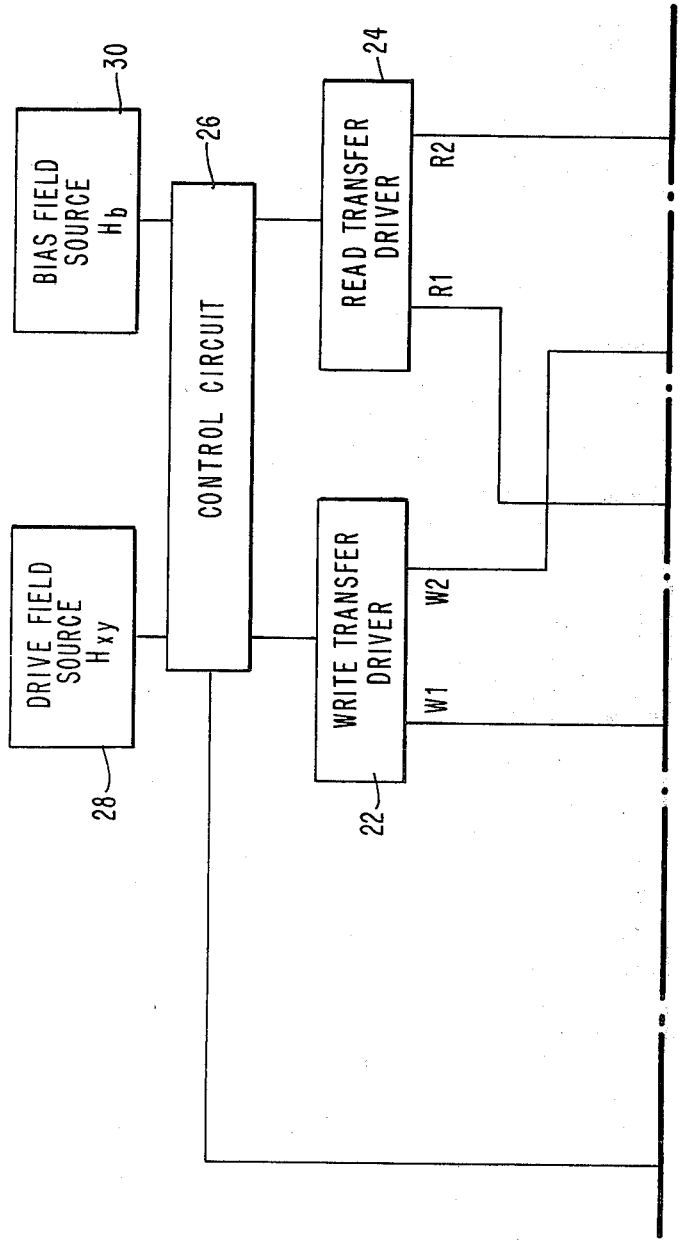

IMPROVED BUBBLE DOMAIN STORAGE ARRAY

DESCRIPTION

Technical Field

This invention relates to magnetic bubble domain storage systems, and more particularly to a storage system in which magnetic chips are arranged in an array, wherein individual chips in the array can be selected for write and read operations. The selection technique is such that one out of many magnetic chips can be selected for both write and read operations.

Background Art

Coincident selection of magnetic memories is well known in the art, and such techniques have also been applied to magnetic bubble domain memories. For example, U.S. Pat. No. 3,703,712 describes a mass memory organization in which a plurality of magnetic bubble domain chips are arranged in an array. Four of the chips share a common sense amplifier so that one out of four of the shared chips can be selected during a read operation. Two of the four chips are selected by pulsing the appropriate current line. The sense signals from the two selected chips are time-displaced with respect to one another so that it is possible to know which of the four chips is providing an output signal at any given instant of time.

While the mass memory organization in U.S. Pat. No. 3,703,712 uses coincident selection for writing information into the storage chips, it does not provide true coincident selection of any one of several (more than four) chips for readout. Although this patent does say that a sense amplifier can serve "at least four neighboring memories" in column three, line 9 thereof, no such technique is suggested which permits the sense amplifier to serve more than four memories. Further, since a read-out bridge circuit is utilized, the four legs of the bridge circuit are used for the four chips which share a sense amplifier.

In the design of a magnetic bubble domain memory, it is desirable to arrange magnetic chips in an array comprising columns and rows of the chips. It is also advantageous to provide arbitrary selection of the chips for both the read and write operations, so that information can be written into any selected chip or read from any selected chip. Still further, it is desirable to be able to provide a technique whereby information can be written back into a chip from which information is read during the same cycle of movement of the information in the register in which it is stored. This latter aspect is particularly important as the size of the bubble domains decreases, since transfer switches of the replicate type are not suitable for use with extremely small bubble domains. Therefore, in magnetic bubble domain chips using bubble domains having diameters less than about 2 microns, it is often necessary to use simple transfer switches rather than the types which replicate and transfer out a replicated domain while retaining the same domain in storage. For a storage register having a first access position for read-out of information and a second access position for write-in of information, it is desirable to be able to replace the information read-out in order to provide non-destructive read-out without the use of replicate switches. If restoration of data takes place as soon as the now empty bit position arrives at the second access position from the first access position, high data rates will also be maintained.

Accordingly, it is an object of the present invention to provide improved selection of magnetic bubble domain memory chips, for both write and read operations.

It is another object of the present invention to provide improved selection in magnetic bubble domain storage array which is particularly suitable for use with magnetic bubble domains having diameters less than about 2 microns.

It is another object of the present invention to provide improved selection in an array of magnetic bubble domain chips wherein a common sense amplifier is shared by more than four storage chips.

It is another object of the present invention to provide a magnetic bubble domain storage array comprising a plurality of magnetic bubble domain chips, wherein information can be written back into a storage chip from which information was read, during the same (or a different) storage cycle of information in the chip.

BRIEF SUMMARY OF THE INVENTION

This magnetic bubble domain storage system is comprised of a plurality of magnetic bubble domain storage chips, arranged in an array of rows and columns. Each storage chip provides a plurality of bubble domain storage positions and means for moving the bubble domains from one storage position to the next. For example, a magnetic chip may comprise a substrate and a magnetic film which supports bubble domains. Circuitry is provided for moving magnetic bubble domains in the chip and access paths are provided for bringing bubble domains to storage and for taking bubble domains from storage. An example of a storage chip is one which is organized in a major/minor loop memory organization of the type well known in the prior art.

Each logical or storage chip in the array is organized into half-chips, with even numbered bits being in one half-chip and odd numbered bits in the other half-chip. Each of the half-chips can be, for instance, organized as a major/minor loop memory organization. In the array organization, the rows of even numbered half-chips alternate with the rows of odd numbered half-chips. Bubble domains are written into a row of even numbered half-chips and a row of odd numbered half-chips at the same time. During an incoming sequence of bits, even numbered bits go into the even numbered half-chips and odd numbered bits in the sequence go into the odd numbered half-chips.

For the readout operation all chips, both even and odd, in a selected column are read out by pulsing the same current line. Each half-chip has a sensor for detecting information stored in that half-chip. The sensors in a row of even numbered half-chips are connected together in series and form one leg of a bridge circuit. The series connection of sensors associated with odd numbered half-chips in another row are connected together and form another leg of the same bridge circuit. Resistors form the other two legs of the bridge circuit. A sense amplifier is connected across opposite terminals of the bridge.

During readout, a current pulse on a selected readout line causes all half-chips in a column to be read out. Time displaced signals corresponding to even numbered and odd numbered bits will be obtained at the sense amplifier output.

These and other objects, features, and advantages will be more apparent from the following more particular description of the preferred embodiments.

BRIEF DESCRIPTION OF THE DRAWINGS

FIGS. 3 through 3B show a storage array comprised of four even numbered half-chips and four odd numbered half-chips, and more particularly shows the structure for selection of chips for the write and read operations.

DETAILED DESCRIPTION OF THE PREFERRED EMBODIMENTS

Figure 1:
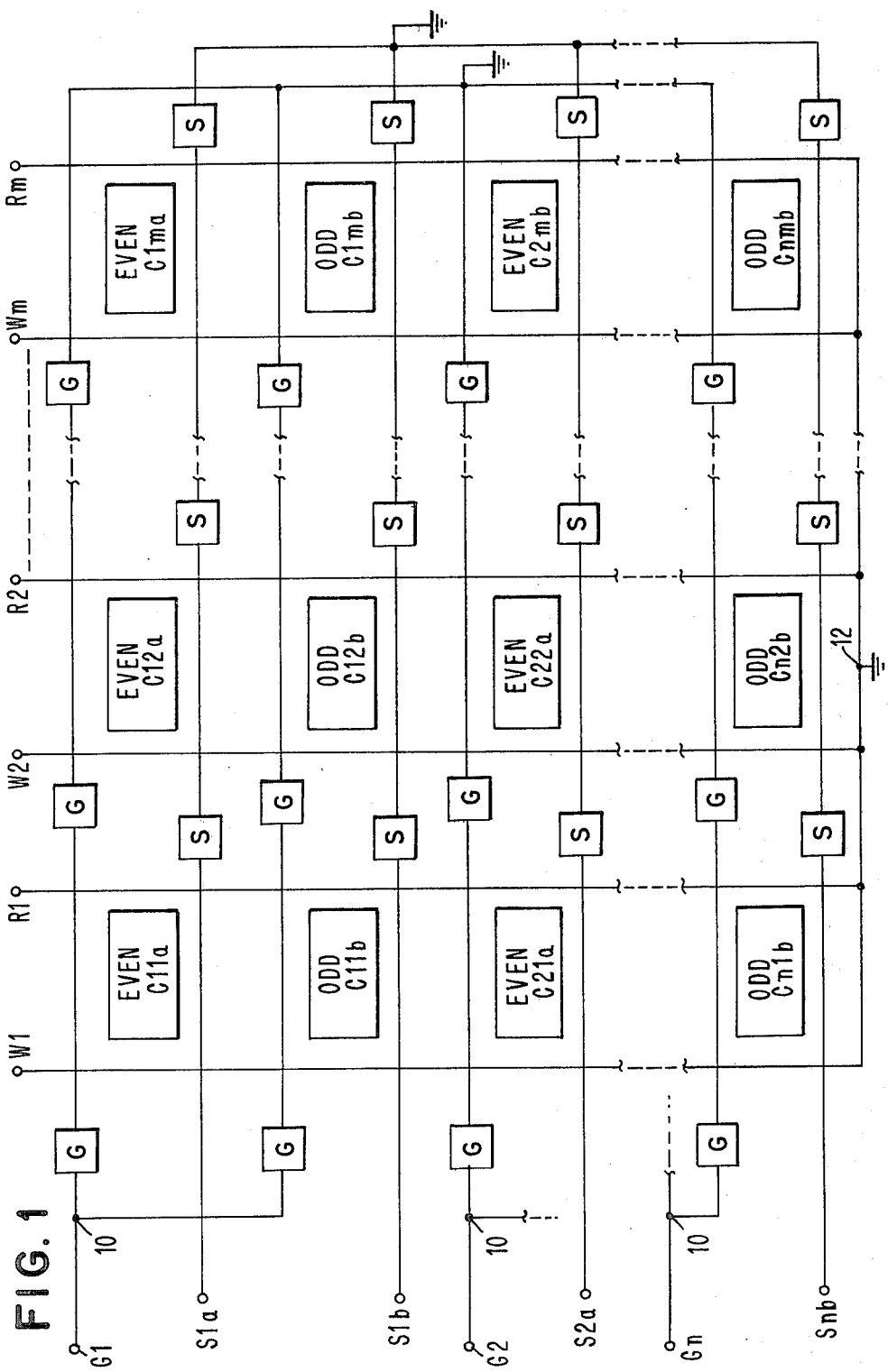
FIG. 1 is a storage array in accordance with the present invention, illustrating a plurality of half-chips for storing even numbered and odd numbered bits, which can be individually accessed for both write and read operations.

Storage Organization (FIG. 1)

FIG. 1 shows an array of magnetic bubble domain chips Cnm, where n=1, 2, ... n and m=1, 2, ... m. The integer n tells the row in which the chip is located while the integer m tells the column in which the chip is located. These chips can be individually accessed for writing bubble domains into them and for reading bubble domains from them.

Each chip Cnm is a logical half-chip which either stores even numbered bits in a bit sequence or odd numbered bits in a bit sequence. Alternating rows of half-chips are used to store even numbered bits and odd numbered bits, respectively. Thus, the half-chips C11a, C12a, ... C1ma in the first row (a) are used to store even numbered bits in a bit sequence while half-chips C11b, C12b, ... C1mb are used to store odd numbered bits in the second row (b) of the array. Rows (a) and (b) of half-chips, when taken together, form one row of complete chips (i.e., both even and odd bits are stored).

Coincident selection is used to write bubble domain information into the half-chips of the array. The individual bubble domain generators associated with each half-chip are labeled G, and the current carrying lines used to trigger action of the generators G are the lines G1, G2, ... Gn. A single current carrying line G1-Gn is used to trigger the action of two rows of bubble domain generators G. For example, line G1 is connected to generators G serving the top row of half-chips and also is connected to the generators serving the second row of half-chips, through the electrical node 10. When a current pulse is present in line G1, bubble domains will be written into both the even half-chips in top row (a) and the odd half-chips in top row (b). Bubble domains which are not required will be sent to annihilators (not shown in FIG. 1) and the geometry of the apparatus is such that even numbered bits will be placed in the half-chips in top row (a) while odd numbered bits will be placed in the half-chips in top row b. This will be explained further with respect to FIG. 2. Currents can be present at the same time in all the lines G1-Gn.

The plurality of the current carrying conductors, W1, W2, ... Wm extend in a vertical direction across the array of half-chips. These are the write transfer lines which are used to transfer bubble domain information produced by generators G into the half-chips. For example, if it is desired to write bubble domain information into the half-chips in the first column of chips (i.e., half-chips C11a, C11b, C21a, ... Cn1b), a current pulse is sent along line W1.

In order to read information from the half-chips, the read transfer lines R1, R2, ... Rm are used. These current carrying lines extend in the same direction as the lines W1-Wm, and also are connected to ground at node 12. By passing a current along one of the read transfer lines, bubble domain information in the associated half-chips will be read from those half-chips. For example, in order to read information from the first column of half-chips C11a, C11b, ... Cn1b, a current pulse flows in line R1. This will remove information from the half-chips in column 1, which information will be sensed by the bubble domain sensors S associated with this column of half-chips. In this regard, a sensor S is provided for each half-chip.

Figure 5:
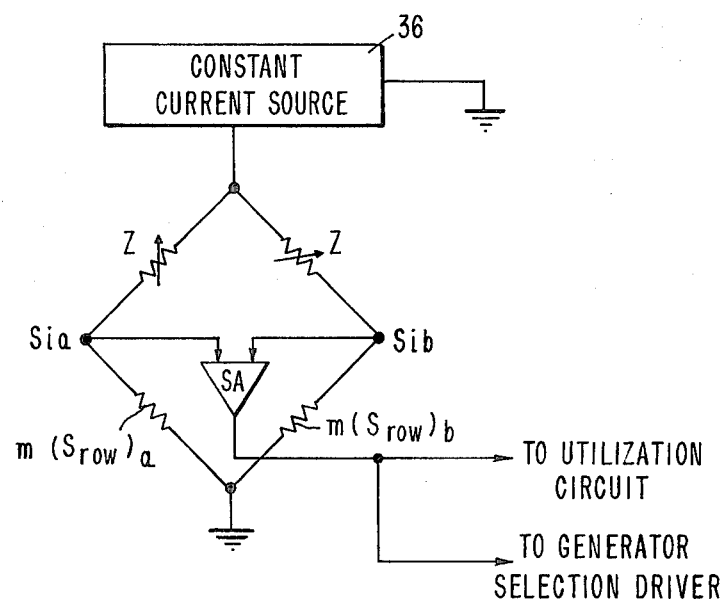
FIG. 5 shows in more detail one of the bridge circuits of FIG. 3, and illustrates the connection of individual sensors to the bridge circuit.

The sensors associated with any row of half-chips are connected in series and form one leg of a bridge circuit (FIG. 5). The terminal pads to which series connected sensors are connected are terminals S1a, S1b, S2a, ... Snb. In FIG. 1, adjacent rows of series connected sensors are connected to the same bridge circuit. For example, the series connection of sensors serving chips C11a-C1ma in the top row of the array form one leg of a bridge circuit while the sensors serving the half-chips C11b-C1mb in the second row of the array from another leg of this same bridge circuit. Thus, terminals S1a and S1b are diametrically opposite on the same bridge circuit, as can be seen by referring to FIG. 5.

Since even numbered bits are sensed at different times than odd numbered bits, the sense amplifier connected to any bridge circuit will provide a continuous output indicative of the total bit sequence comprised of even and odd numbered bits. Thus, the data rate through the sensors will be preserved, since an output will be obtained for each bit position in a sequence of bubble domain bits.

As is apparent from FIG. 1, a plurality of half-chips are connected to the same bridge circuit and share the same sense amplifier. This means that any one of a number of half-chips in a row can be selected for readout at any time. This contrasts with the prior art, where a maximum of four chips are connected to the same sense amplifier and wherein it is possible only to pick one out of four for readout. The scheme presented in FIG. 1 provides true arbitrary selection of any half-chip in a row or column of half-chips, where the array is nxm half-chips.

Figure 2:
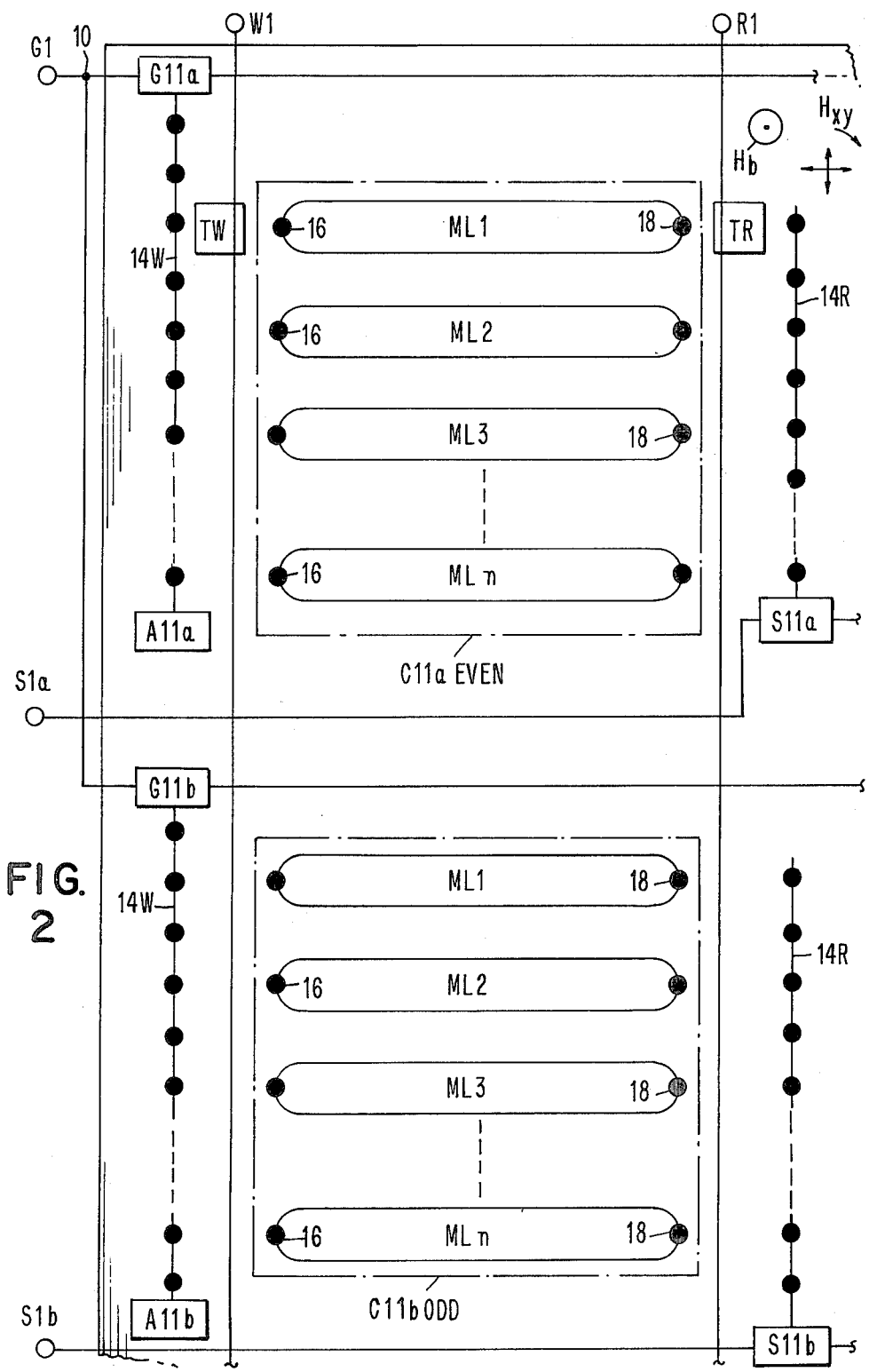
FIG. 2 illustrates in more detail a portion of the storage array of FIG. 1, and more particularly shows an even half-chip and an odd half-chip, together with the associated generators and sensors.
Figure 3B:
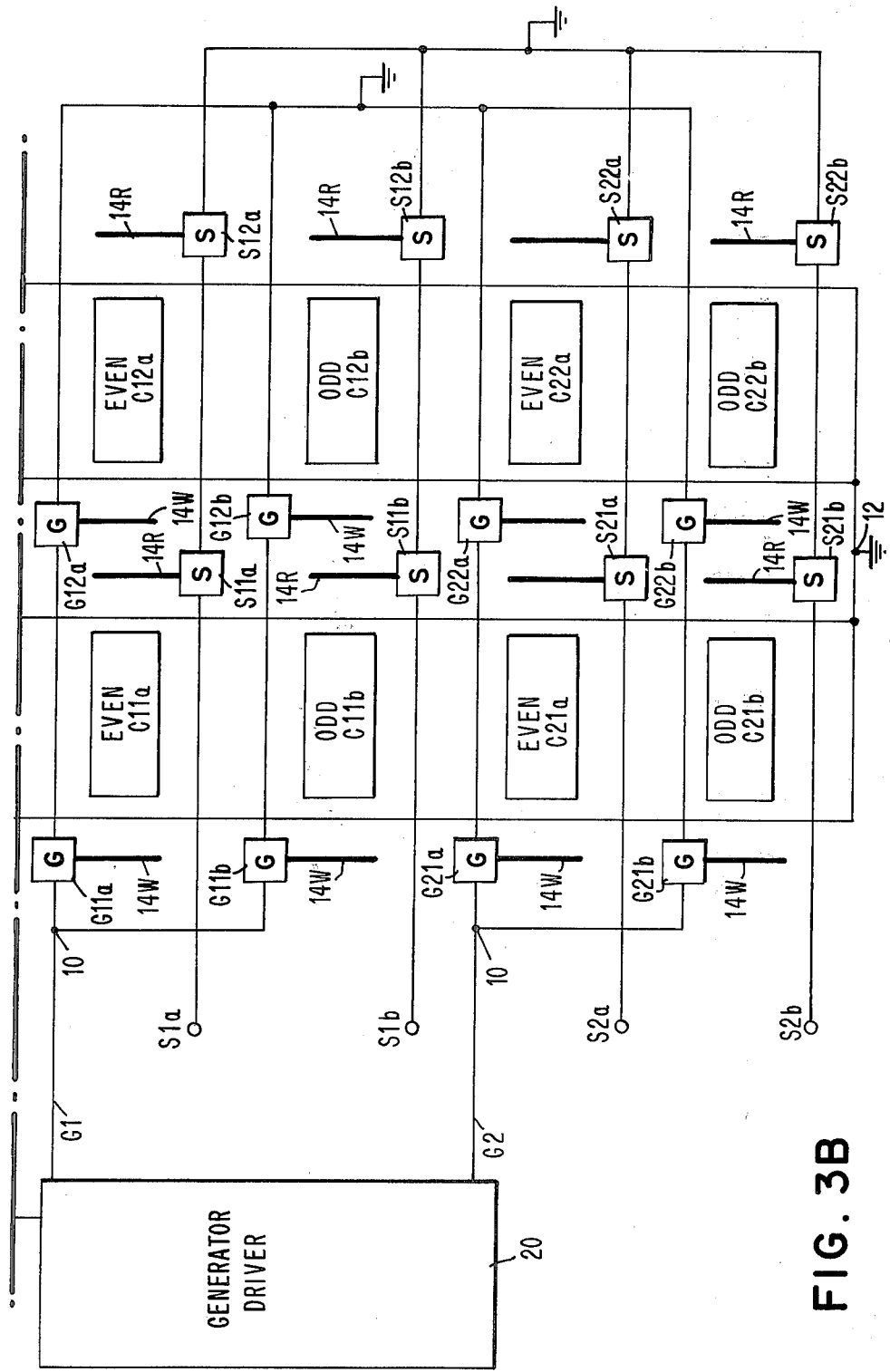

Detailed discussions of the write and read operations will be explained more fully after FIGS. 2 and 3 are described.

FIG. 2

FIG. 2 illustrates a portion of the storage array of FIG. 1, and more particularly shows half-chips C11a and C11b, and the circuitry associated with them for writing and reading bubble domains.

In more detail, chips C11a and C11b are comprised of minor loops ML1, ML2, ... MLn. In the case of a major/minor loop bubble domain memory of a type well known in the art, loops ML1-n can be the minor loops used for storage of bubble domain information. Each half-chip has associated therewith a write major path 14W and a read major path 14R. These are well known bubble domain propagation paths. Write major path 14W is used to bring bubble domains from a generator G to positions opposite the (write-in) access positions 16 in the minor loops, for transfer into the minor loops when the write transfer line W1 is pulsed. The darkened circles along major path 14W represent bit positions along that path. As is apparent, the minor loops are separated from one another by two bit positions and generator G11A is located three positions from the access position 16 on the left-hand side of minor loop ML1.

Darkened circles along read major path 14R also represent bit positions along that major path. The (readout) access positions 18 on the right-hand side of the minor loops are the bit positions from which information is transferred from the minor loops to the read major path 14R. A current pulse on the read transfer line R1 is used to transfer information from bit positions 18 to path 14R.

Current controlled transfer switches are used to move information from write major path 14W to the minor loops and to remove information from the minor loops to the read major path 14R. A write transfer gate is represented by the box labeled TW, while a read transfer gate is represented by the box TR. Although only two transfer gates are shown for ease of illustration, it will be readily understood by those of skill in the art that a current controlled transfer gate is used between write and read major paths and each of the minor loops in the half-chip. Many types of current actuated transfer gates are known in the art, and in the practice of this invention it is most desirable to use a transfer gate which does not replicate the bubble domain to be removed from storage. Thus, in the practice of this invention bubble domains are removed from the minor loops, travel downwardly in read major path 14R to the associated sensor S, and are annihilated there after being sensed. Many types of sensor-annihilators are known in the art, such as that shown in U.S. Pat. No. 3,781,832.

Generator line G1 is connected to bubble domain generator G11a and also to generator G11b. Thus, both bubble domain generators G11a and G11b are actuated at the same time. In this system of reference, G11a means that it is the bubble domain generator connected to current line G1, and is the first such bubble domain generator in row a connected to line G1. Bubble domain generator G11b is the first bubble domain generator in row b which is connected to line G1.

When a current pulse is applied to line G1, bubble domains are generated by G11a and G11b. However, G11a is located three bit positions away from access position 16 in minor loop 1 of chip C11a, while generator G11b is located two bit positions away from bit position 16 in minor loop 1 of half-chip C11b. This means that bubble domains will be available to be placed into half-chip C11b at an earlier time than they will be available for placement into half-chip C11a. The first bit will be placed into half-chip C11b, as will be the third bit, fifth bit, etc. In the write operation, the number of bits in the write major paths and the phasing of the current pulses in line W1 used to transfer bubbles from major paths 14W into half-chips C11a and C11b are adjusted so that odd bits are transferred into half-chip C11b and even numbered bits are transferred into half-chip C11a.

In order to store data in the minor loops of half-chip C11a it is necessary to first generate data in all half-chips in the first row using line G1. However, data is transferred only into half-chip C11a by pulsing the write transfer line W1. Data will not be transferred into half-chip C12a (in the top row of half-chips) unless write transfer line W2 is exercised. Thus, data produced by the other generators in the top row proceed down their major write paths 14W of the associated annihilators. Consequently, half-chip C11a is presence selected for the write operation by the coincidence of currents in lines G1 and W1.

During the read operation, bubble domains are transferred out of the minor loops in a storage chip into the associated read major path 14R. This is done by exercising the appropriate read transfer line Ri (i=1, 2, ..., m). The read transfer lines are a series or parallel connection of transfer conductors on a column of logical half-chips. In FIG. 1, the read transfer conductors are arranged in series for all half-chips in a column. As in the case of the write major path 14W, the number of bit positions between the transfer-out switches TR and the associated sensors on the half-chips are adjusted so that bubbles from one half-chip are detected on even field cycles and bubbles from the other half-chip are detected on odd field cycles. Here, a field cycle is defined as a cycle of the drive field $H_{xy}$ used to move magnetic bubble domains in the chips, and is typically a rotating magnetic field which is in the plane of the magnetic medium in which the bubbles are moved. Thus, major path 14R associated with half-chip C11a has one bit position between the access position 18 of minor loop MLn and the associated sensor S11a, while major path 14R associated with half-chip C11b has two bit positions between access position 18 on loop MLn and sensor S11b.

As stated previously, the series connection of the sensors in a row of even half-chips is balanced against the series connection of sensors from a row of odd half-chips and both series connections are served by a single sense amplifier connected to a bridge circuit, as will be described with respect to FIG. 5. On even field cycles an even half-chip sensor detects data, while the odd half-chip sensors act as dummy sensors. On odd field cycles an odd half-chip sensor detects data while the even half-chip sensors act as dummy sensors. In this manner, data is read out in parallel from all logical half-chips in a selected column.

Assuming a square array of n x n logical chips (m=n) in comparison to a single major/minor loop chip, this array selection technique provides access times which are n times faster to n parallel bits instead of only one bit. The pin count is roughly n times as large; however, even an 8×8 array could be made with a total of 41 pins, which is not an impractical number. In comparison to earlier mass memory organizations, such as that represented by aforementioned U.S. Pat. No. 3,703,712, the array of the present invention requires n/2 fewer sense amplifiers and fewer pins.

FIG. 3

FIG. 3 shows a 4×2 chip array where n=4 and m=2. Also shown are the drivers associated with the various current carrying lines used for selection, as well as the series connections of sensors which form legs of bridge circuits. The write major paths 14W and the read major paths 14R are shown for each of the half-chips, but the associated annihilators are not shown for ease of illustration.

The generator current lines G1, G2, . . . are connected to a generator driver 20, which provides current pulses in the appropriate generator lines G1 and G2. If line G1 is exercised, bubble domain generators associated with half-chips in the top two rows of the array are activated, while if line G2 is activated bubble domain generators associated with half-chips in the bottom two rows of half-chips are activated. Lines G1 and G2 can be driven at the same time.

The write transfer lines W1 and W2 are connected to a write transfer driver 22 which provides current pulses on these lines for selectively activating write transfer lines W1 and W2. This enables information to be written into either the left-hand column of half-chips or the right-hand column of half-chips.

The read transfer lines R1 and R2 are connected to the read transfer driver 24, which provides current pulses in these lines to effect the read-out of information from the half-chips in the left and right-hand columns of chips shown in this FIG. Thus, to read out the half-chips in the left-hand column of the array, a current pulse would be applied by driver 24 in write transfer conductor R1.

A control circuit 26 provides timing pulse inputs to drivers 20, 22, and 24, to control the sequence of operation of these drivers. Control circuit 26 can also provide timing inputs to the drive field source 28 which provides the reorienting magnetic field $H_{xy}$, and to the bias field source 30, which provides the stabilizing bias field $H_b$.

As mentioned previously, the series connection of sensors associated with a row of even half-chips is connected to one leg of a bridge circuit while the series connection of sensors associated with a row of odd half-chips is connected to another leg of the same bridge circuit. Thus, in FIG. 3, sensors S11a and S12a are connected in series and are one leg of a bridge circuit. Sensors S11b and S12b are series connected and are another leg of the same bridge circuit. Another bridge circuit serves the sensors associated with the half-chips in the bottom two rows of the array.

SENSOR BRIDGE CIRCUITS (FIGS. 4 & 5)

Figure 4:
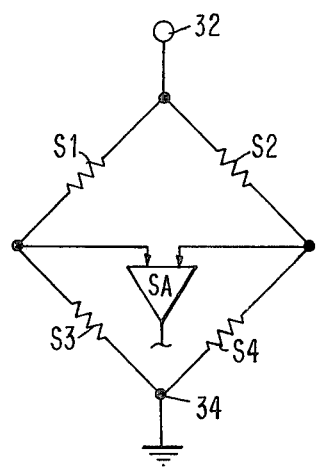
FIG. 4 shows a bridge circuit used for sensing magnetic bubble domains from four chips in accordance with the prior art.

FIG. 4 represents a bridge circuit characteristic of those in the prior art, and in particular one that is represented by aforementioned U.S. Pat. No. 3,703,712. Here, the sensing elements S1-S4 associated with four chips are connected to form four legs of a bridge circuit. A sense amplifier SA is connected across diagonally opposite terminals of the bridge, and a current source (not shown) is connected to terminal 32, while terminal 34 is grounded. The sense amplifier output is sent to a utilization circuit which is not shown in this drawing.

In the operation of the bridge circuit of FIG. 4, two of the four sensors S1-S4 are selected at any one time, and the sense signals from the two selected sensors are time displaced with respect to each other. With this circuitry, it is possible to select one out of four of the chips connected to the bridge for bubble domain read-out.

In contrast with the circuit of FIG. 4, the present invention uses a different read-out technique, as represented by the bridge circuit of FIG. 5. Here, the series connection of sensors in a row of even half-chips forms one leg of the bridge while the series connection of sensors associated with a row of odd half-chips forms another leg of the bridge circuit. These are balanced by impedances Z.

In more detail, a series connection of sensors in a row of even half-chips is designated $m(S_{row})_a$, while a series connection of sensors in a row of odd half-chips is designated $m(S_{row})_b$. For example, sensors S11a and S12a in FIG. 3 are connected together between terminal Sia (i=1) and ground in the bridge circuit of FIG. 5, while the series connection of sensors S11b and S12b are connected between terminal Sib (i=1) and ground in the bridge circuit. A constant current source 36 is connected across the other terminals of the bridge circuit, and the output of the sense amplifier SA is sent to a utilization circuit, such as a general purpose computer. The output of the sense amplifier can also be fed back to the generator selector driver 20 (FIG. 3) in order to write information read from a half-chip back into that same half-chip during the same storage cycle of movement of the bit position corresponding to that information around the minor loop. If the length of the minor loops in the half-chips is set so that the appropriate transfer bit position is as far from the bubble generator as the empty bit position in storage is far from the transfer bit position when the information is sensed, the same (or different) information can be written back into that bit position in the same storage cycle. Thus, in one cycle of movement of the bit position around the storage loop, information is read-out and rewritten in the same bit position.

A patent of M. H. Kryder, U.S. Pat. No. 4,035,785, describes a bridge circuit in which alternating bits (even and odd) are sensed without loss of data rate.

In the practice of the present invention, a preferable mode of operation is to read a bit sequence eight bits wide and to write back eight bits at the same time, i.e., in the same storage cycle. This will require an array having 16 half-chips in a column and 8 sense amplifiers. However, the invention need not be operated in this manner, the principle of the invention being a structure for arbitrary selection of information in a magnetic bubble domain chip, for both the read and write operations. Thus, while major/minor loop types of memory organizations are shown for each of the half-chips, it will be understood by those of skill in the art that the principle of the invention is extendable to half-chips which are structured in other ways.

The storage array and the associated drive conductors are arranged so that true arbitrary selection is provided for both read and write operations and wherein the data rate is the same as if only one storage chip is provided. This structure is particularly suitable for very small magnetic bubble domain devices where replicate type transfer switches are disadvantageous. Use of a storage array configured such as the present array means that simple transfer switches can be used without impacting the available data rate while still maintaining effective non-destructive read-out at the system level.

It will be understood by those of skill in the art that chargecoupled devices (CCD) can be arranged in the same type of storage chips as the bubble domain chips shown herein. Thus, the principles of this invention and the claims include both CCD storage chips and bubble domain storage chips.

Having thus described our invention, what we claim as new, and desire to secure by Letters Patent is:

1. A magnetic bubble domain storage chip, comprising:

a first plurality of bubble domain half-chips for storing even numbered bits in a sequence of information bits, a second plurality of bubble domain half-chips for storing odd numbered bits in a sequence of information bits, each of said half-chips in said first and second plurality including:

a magnetic medium in which said bubble domains can be stored, a write means for writing bits of information represented by bubble domains into said half-chip, read means for reading bits of bubble information from said half-chip, said read means including a bubble domain sensor, first selection means connected to said write means for writing a bubble domain pattern of information into said half-chips, including means for writing even numbered bits into a selected first half-chip and odd numbered bits into a selected second half-chip, second selection means connected to said read means for reading a bubble domain pattern of information from said half-chips, said second selection means including means for reading even numbered bits from said selected first half-chip and odd numbered bits from said selected second half-chip, where said first plurality of half-chips are arranged in first rows and said second plurality of half-chips are arranged in second rows, said second selection means including:

first means for serially connecting the bubble domain sensors for half-chips in one of said first rows, second means for serially connecting the bubble domain sensors for half-chips in one of said second rows, a bridge circuit across which a sense amplifier is connected, one of the legs of said bridge circuit including the series connection of sensors in said one of said first rows, and another leg of said bridge circuit including the series connection of sensors in said one of said second rows, where said write means for each half-chip in a first row are connected, and said write means for each half-chip in a second row are connected, and including a driver for activating at the same time the write means for any row of half-chips in a first row and the write means for any row of half-chips in a second row, including means for selecting any half-chip in any row of half-chips for readout of bubble domain bits from such selected half-chip, where each said bubble domain half-chip is organized in a major/minor loop memory organization, including:

a write major path which receives bubble domains from said write means, a read major path which sends bubble domains to said read means, write transfer switches for moving bubble domains from said write major path to storage in said half-chip, and read transfer switches for moving bubble domains from storage to said read major path, said write transfer switches being activated by current carrying lines forming part of said write means, and said read transfer switches being activated by current carrying lines forming part of said read means.

2. A magnetic bubble domain storage system, comprising:

an array of bubble domain chips for storing patterns of magnetic bubble domains, said arrays comprising:

first rows of chips for storing even numbered bits in an information sequence of bits, second rows of chips for storing odd numbered bits in an information sequence of bits, each bubble domain chip including a bubble domain generator for writing bubble domains into said chip and a bubble domain sensor for sensing bubble domains in said chip, write selection means for writing bubble domains produced by said generators into any selected chip for storing even numbered bits and into any selected chip for storing odd numbered bits, read selection means for reading bubble domains from a selected one of said chips, said read selection means including means for electrically connecting in series the sensors associated with each row of chips, and means for moving bubble domains from any selected chip to the sensor associated with said selected chip, a bridge circuit having as one leg thereof the series connection of sensors associated with any of said first rows of chips and having as another leg thereof the series connection of sensors associated with any of said second rows of chips.

3. The storage system of claim 2, including first means to connect a sensor associated with any selected chip for storing even numbered bits to said bridge circuit, and second means to connect at the same time a sensor associated with a selected chip for storing odd numbered bits to said bridge circuit.

4. The storage system of claim 3, where said first rows and second rows contain more than four chips, and where said read selection means includes means for selecting for readout selected ones of the chips in said first and second rows.

5. The storage system of claim 3, where said array is comprised of alternating ones of said first and second rows of chips.

6. The storage system of claim 5, where said bubble domain generators are current activated, the generators associated with a row of chips for storing even numbered bits and the generators associated with a row of chips for storing odd numbered bits being actuated by the same current pulse.

7. The storage system of claim 5, where the write selection means and the read selection means each include a pair of current carrying conductors associated with each chip for selection of any one chip for writing in information and for reading out information.

8. A magnetic bubble domain storage system, comprising:

a plurality of chips arranged in an array, some of which chips store even numbered bits in a sequence of bits and others of which store odd numbered bits in a sequence of bits, each said chip including:

a bubble domain generator, a bubble domain sensor, storage shift registers for moving bubble domains in said chip, a write selection means including two sets of current carrying conductors, one set of which produces a bubble domain pattern and the other set of which transfers said pattern into said storage shift registers, and means for activating a selected one of said conductors from each of said sets to write a bubble domain pattern into any selected chip, read selection means including two sets of current carrying conductors, one set of which includes conductors connected to said sensors and the other of which includes conductors for transferring a bubble domain from said storage chips to said sensors, and including means for activating a selected one of said conductors from each set of conductors for reading a bubble domain pattern in any selected chip in said array, said array including more than four of said chips, a bridge circuit including as a first leg thereof a sensor associated with a chip for storing even numbered bits and having another leg thereof including a sensor associated with a chip for storing odd numbered bits, a sense amplifier connected across said bridge circuit and shared by more than four of said chips, and means to select one out of said more than four chips sharing said sense amplifier for readout.

9. The storage system of claim 8, where said bubble domains have diameters less than 2 microns.

10. The storage system of claim 9, where one leg of said bridge circuit is a series electrical connection associated with chips for storing even numbered bits, and another leg is a series electrical connection of more than four sensors associated with chips for storing odd numbered bits.

11. A bubble domain storage system, comprising:
a plurality of chips arranged in an array, some of which chips store even numbered bits in a sequence of bits and others of which store odd numbered bits in a sequence of bits, each said chip including:
a bubble domain generator,
a bubble domain sensor,
storage shift registers for moving bubble domains in said chip, write selection means including two sets of current carrying conductors, one set of which produces a bubble domain pattern and the other set of which transfers said pattern into said storage shift registers, and means for activating a selected one of said conductors from each of said sets to write a bubble domain pattern into any selected chip, a sense amplifier shared by more than two chips for storing even numbered bits and more than two chips for storing odd numbered bits, said sense amplifier being connected to a bridge circuit one leg of which is a series electrical connection of sensors associated with all chips in a row of chips for storing even numbered bits while another leg thereof is a series electrical connection of sensors associated with all chips in a row of chips for storing odd numbered bits, read selection means for selecting one of said sensors in one leg of said bridge circuit to provide a signal to said sense amplifier and for selecting one of the sensors in said another leg of said bridge circuit to provide a signal to said sense amplifier.

12. The bubble domain storage system of claim 11, including means for writing information read from any selected chip back into said chip in the same or later storage cycle.

* * * * *